United States Patent
Nakata et al.

(10) Patent No.: US 12,334,816 B2
(45) Date of Patent: Jun. 17, 2025

(54) NOISE REDUCTION DEVICE, POWER CONVERSION DEVICE, VEHICLE, AND NOISE REDUCTION METHOD

(71) Applicant: Panasonic Intellectual Property Management Co., Ltd., Osaka (JP)

(72) Inventors: Hideki Nakata, Osaka (JP); Atsushi Seki, Kanagawa (JP); Junichi Yukawa, Nara (JP)

(73) Assignee: Panasonic Automotive Systems Co., Ltd., Kanagawa (JP)

( * ) Notice: Subject to any disclaimer, the term of this patent is extended or adjusted under 35 U.S.C. 154(b) by 71 days.

(21) Appl. No.: 18/165,722

(22) Filed: Feb. 7, 2023

(65) Prior Publication Data

US 2023/0299667 A1    Sep. 21, 2023

(30) Foreign Application Priority Data

Mar. 18, 2022  (JP) ................. 2022-043788

(51) Int. Cl.
| | |
|---|---|
| H02M 1/44 | (2007.01) |
| B60R 16/02 | (2006.01) |
| G01R 31/28 | (2006.01) |
| H02M 3/155 | (2006.01) |

(52) U.S. Cl.
CPC ............. H02M 1/44 (2013.01); B60R 16/02 (2013.01); G01R 31/282 (2013.01); H02M 3/155 (2013.01)

(58) Field of Classification Search
CPC .......... H02M 1/44; H02M 3/155; H02M 1/32; H02M 1/36; B60R 16/02; G01R 31/282
See application file for complete search history.

(56) References Cited

U.S. PATENT DOCUMENTS

| | | | | |
|---|---|---|---|---|
| 10,177,702 | B2* | 1/2019 | Shimura | H02M 1/44 |
| 10,250,124 | B2* | 4/2019 | Nakano | H02P 29/68 |
| 2016/0043629 | A1* | 2/2016 | Joo | H02M 1/36 |
| | | | | 363/55 |
| 2017/0294844 | A1* | 10/2017 | Nishijima | H02M 3/33571 |
| 2018/0138844 | A1* | 5/2018 | Harada | H02P 29/0241 |
| 2019/0058418 | A1* | 2/2019 | Mori | G01R 31/40 |
| 2021/0061113 | A1* | 3/2021 | Ellis | H02J 7/0029 |
| 2023/0086132 | A1* | 3/2023 | Miyazaki | H02M 1/0009 |
| | | | | 361/101 |

FOREIGN PATENT DOCUMENTS

| | | | |
|---|---|---|---|
| JP | 2009254188 | A | 10/2009 |
| JP | 2012110094 | A | 6/2012 |
| JP | 5621533 | B2 * | 11/2014 |
| JP | 2021108514 | A | 7/2021 |

* cited by examiner

*Primary Examiner* — Jared Fureman
*Assistant Examiner* — Michael J Warmflash
(74) *Attorney, Agent, or Firm* — Seed IP Law Group LLP

(57) ABSTRACT

A noise reduction device according to one embodiment includes a noise reduction circuit and a failure diagnosis circuit. The noise reduction circuit generates an offset signal with reverse polarity of a noise component generated in a load. The failure diagnosis circuit detects a level of the offset signal. The failure diagnosis circuit determines whether or not a detected level of the offset signal deviates from an appropriate range. The failure diagnosis circuit diagnoses, on the basis of a determination result, whether or not a failure has occurred in the noise reduction circuit.

13 Claims, 9 Drawing Sheets

NOISE REDUCTION DEVICE, POWER CONVERSION DEVICE, VEHICLE, AND NOISE REDUCTION METHOD

CROSS-REFERENCE TO RELATED APPLICATIONS

This application is based upon and claims the benefit of priority from Japanese Patent Application No. 2022-043788, filed on Mar. 18, 2022, the entire contents of which are incorporated herein by reference.

FIELD

The present disclosure relates generally to a noise reduction device, a power conversion device, a vehicle, and a noise reduction method.

BACKGROUND

A noise reduction device may generate an offset signal with reverse polarity of a noise component generated in a load of a predetermined circuit, and supply the offset signal to the predetermined circuit or the load (for example, JP 5621533 B2).

The noise reduction device does not operate properly in some cases. In such cases, there is a possibility that a defect occurs due to the noise component generated in the load of the predetermined circuit. For example, when the noise component leaks to another device via a ground potential or the like, this device may be thrown into malfunction.

SUMMARY

A noise reduction device according to the present disclosure includes a noise reduction circuit and a failure diagnosis circuit. The noise reduction circuit is configured to generate an offset signal with reverse polarity of a noise component generated in a load. The failure diagnosis circuit is configured to detect a level of the offset signal. The failure diagnosis circuit is configured to determine whether or not a detected level of the offset signal deviates from an appropriate range. The failure diagnosis circuit is configured to diagnose, on the basis of a determination result, whether or not a failure has occurred in the noise reduction circuit.

DETAILED DESCRIPTION

Hereinafter, an embodiment of a noise reduction device according to the present disclosure will be described with reference to the drawings.

Embodiment

Figure 1:
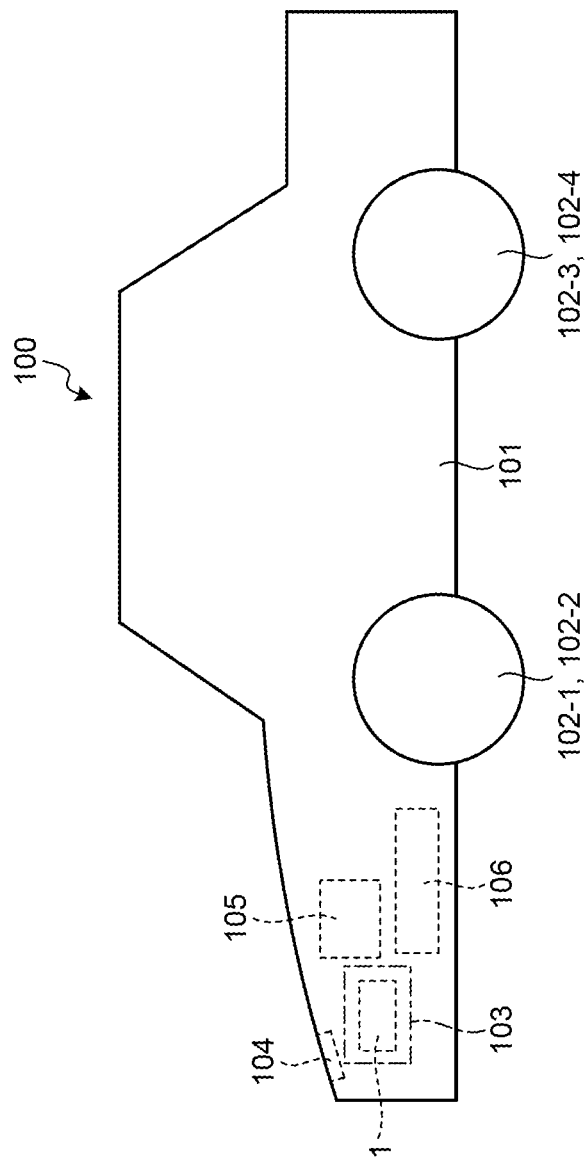
FIG. 1 is a diagram illustrating a schematic configuration of a vehicle on which a power conversion device including a noise reduction device according to an embodiment is mounted.

The noise reduction device according to the embodiment has been made to appropriately perform a noise reduction operation in which an offset signal is generated with reverse polarity of a noise component generated in a load of a predetermined circuit and the offset signal is supplied to the predetermined circuit. A noise reduction device 1 can be mounted in a vehicle 100 as illustrated in FIG. 1. FIG. 1 is a diagram illustrating the vehicle 100 in which the noise reduction device 1 is mounted.

The vehicle 100 includes a plurality of wheels 102-1 to 102-4, a vehicle body 101, and a noise reduction device 1.

Each of the wheels 102-1 to 102-4 is rotatable about an axle. Behind the wheels (first wheels) 102-1 and 102-2, the wheels (second wheels) 102-3 and 102-4 are disposed, and accordingly, a front axle and a rear axle (not illustrated) are disposed. The wheels 102-1 and 102-2 are connected to one end and the other end of the front axle, respectively. The wheels 102-3 and 102-4 are connected to one end and the other end of the rear axle, respectively. In FIG. 1, a configuration in which the vehicle 100 has four wheels 102 is exemplified, but the number of wheels 102 may be 3 or less or 5 or more.

The vehicle body 101 supports the axles in a manner of enabling them to rotate, and wheels 102-1 to 102-4 are coupled via the axles. The vehicle body 101 is movable forward by rotating the wheels 102-1 and 102-2 and the wheels 102-3 and 102-4.

The noise reduction device 1 is disposed in the vehicle body 101. The noise reduction device 1 is included in a power conversion device 103 of the vehicle 100, such as an AC/DC converter, a DC/DC converter, or an inverter. The power conversion device 103 is connected between a power supply PS and a load LD. The power conversion device 103 performs power conversion on power received from the power supply PS and supplies the converted power to the load LD.

In a case where the vehicle 100 is, for example, an electric vehicle or a hybrid vehicle, the power conversion device 103 is, for example, a drive device connected between a motor 106 as the load LD and a battery 105 as the power supply. The power conversion device 103 converts DC power supplied from the battery 105 into AC power and supplies the AC power to the motor 106 as driving power. The motor 106 functions as a power source for rotating the wheels 102-1 and 102-2 and the wheels 102-3 and 102-4.

Alternatively, in a case where the vehicle 100 is equipped with the battery 105 that can be charged from an external power supply, the power conversion device 103 is, for example, an in-vehicle charger connected between a connection terminal 104 to which the power supply PS such as a commercial power supply or a charger of a charging station is to be connected and the battery 105 as the load LD. In the in-vehicle charger, AC power input from the power supply PS passes through a passive noise filter (AC filter (ACF)) and is converted into DC power by a rectifier circuit, and a power factor and a voltage of the DC power are controlled by a PFC circuit (power factor correction circuit). The DC power is converted by the inverter, to which the DC power continues after its power factor and voltage are controlled, into high-frequency AC power to drive an isolation transformer, and the AC power is converted into DC power by a rectifier circuit connected to a secondary side after passing through the isolation transformer, such that the battery 105 is charged with the DC power.

Alternatively, the power conversion device 103 is, for example, a DC-DC converter connected between a low-voltage second battery (not illustrated) as the load LD and the battery 105 as the power supply. The power conversion device 103 insulates DC power supplied from the battery 105 and converts the DC power into low-voltage DC power to charge the second battery.

The power conversion device 103 may be provided with an active noise cancellation (ANC) function. Through the ANC function, the power conversion device 103 receives a noise component, and generates and outputs an offset signal with reversed phase of the noise component, thereby making it possible to suppress emission of an influence of the noise component (electromagnetic interference (EMI) noise or the like).

Figure 2:
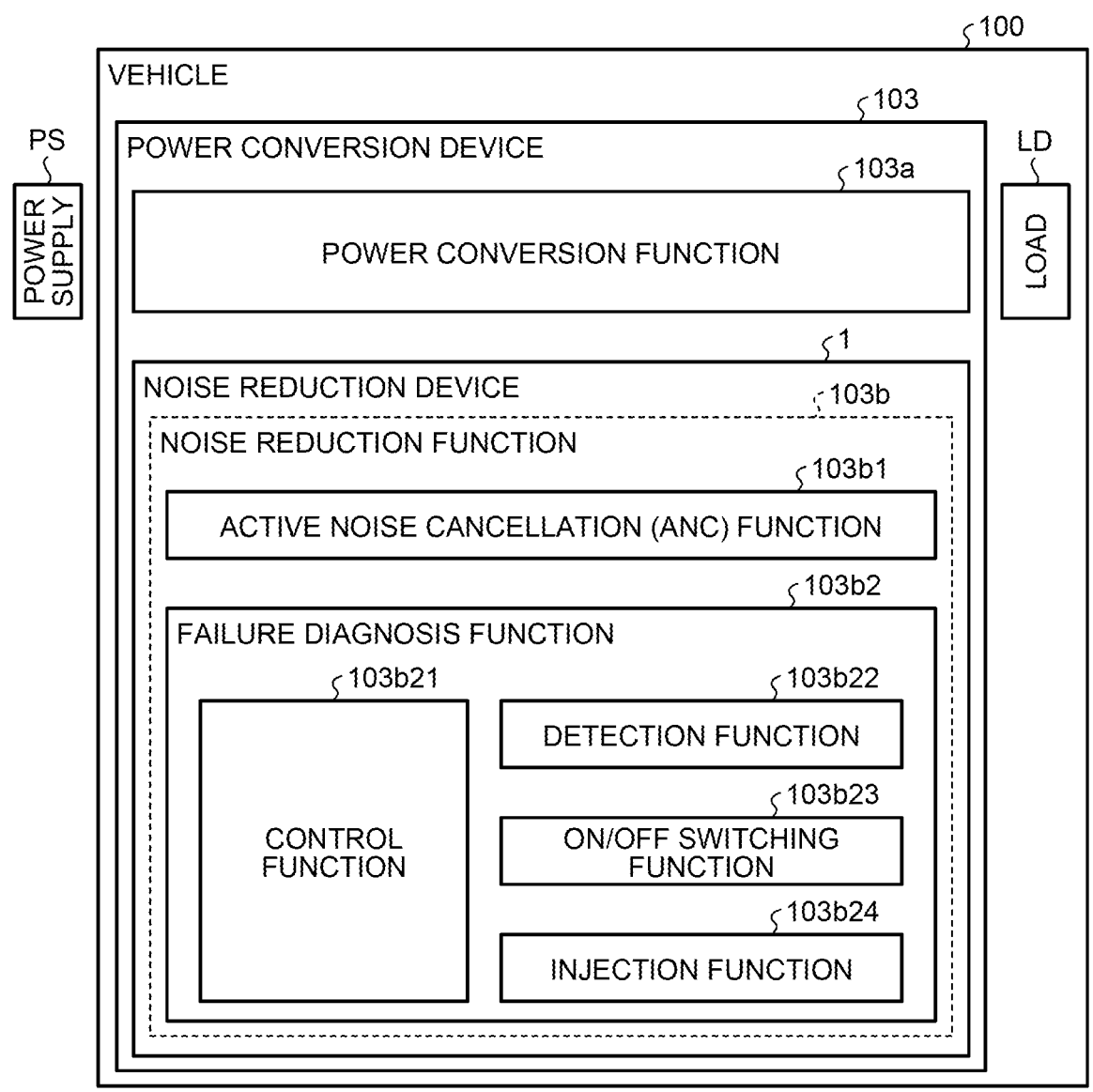
FIG. 2 is a diagram illustrating a functional configuration of the power conversion device including the noise reduction device according to the embodiment.

The power conversion device 103 can be functionally configured as illustrated in FIG. 2. FIG. 2 is a diagram illustrating a functional configuration of the power conversion device 103 including the noise reduction device 1.

The power conversion device 103 includes a power conversion function 103*a* and a noise reduction device 1. The noise reduction device 1 includes a noise reduction function 103*b*. The noise reduction function 103*b* includes an active noise cancellation (ANC) function 103*b*1 and a failure diagnosis function 103*b*2. The failure diagnosis function 103*b*2 is a function of autonomously diagnosing a failure, and can also be referred to as a self-diagnosis function. The failure diagnosis function 103*b*2 includes a control function 103*b*21, a detection function 103*b*22, an ON/OFF switching function 103*b*23, and an injection function 103*b*24.

The ANC function 103*b*1 is a function of applying an offset signal with reverse polarity of a noise component to a circuit unit of the power conversion function 103*a*. The ON/OFF switching function 103*b*23 is a function of switching on/off the operation of the ANC function 103*b*1. For example, the power conversion device 103 is connected to an external power supply PS. When a charge command is issued from an electric control unit (ECU) (not illustrated) to an overall control unit of the power conversion device 103, the control function 103*b*21 enables the injection function 103*b*24 to apply an offset signal to the circuit unit of the power conversion function 103*a*. At this time, the detection function 103*b*22 monitors a level of the offset signal. The control function 103*b*21 checks whether or not the level of the offset signal deviates from a predetermined allowable range. In this case, the control function 103*b*21 may switch the ON/OFF switching function 103*b*23 at an appropriate time if needed. The control function 103*b*21 checks whether or not the level of the offset signal deviates from a predetermined allowable range in accordance with the operation of the ANC function 103*b*1.

In response to determining that the level of the offset signal deviates from the allowable range, the control function 103*b*21 instructs the ON/OFF switching function 103*b*23 to turn off the operation of the ANC function 103*b*1. As a result, it is possible to suppress an influence of EMI noise having a predetermined value or more caused by a failure or the like of the ANC function 103*b*1.

Alternatively, in response to determining that the level of the offset signal deviates from the allowable range, the control function 103*b*21 instructs the ECU to make notification of the occurrence of the failure using a notification device (for example, a warning lamp). As a result, it is possible to urge a driver of the vehicle to cope with the failure of the ANC function 103*b*1, and it is possible to prevent EMI noise having a predetermined value or more from being neglect.

Figure 3:
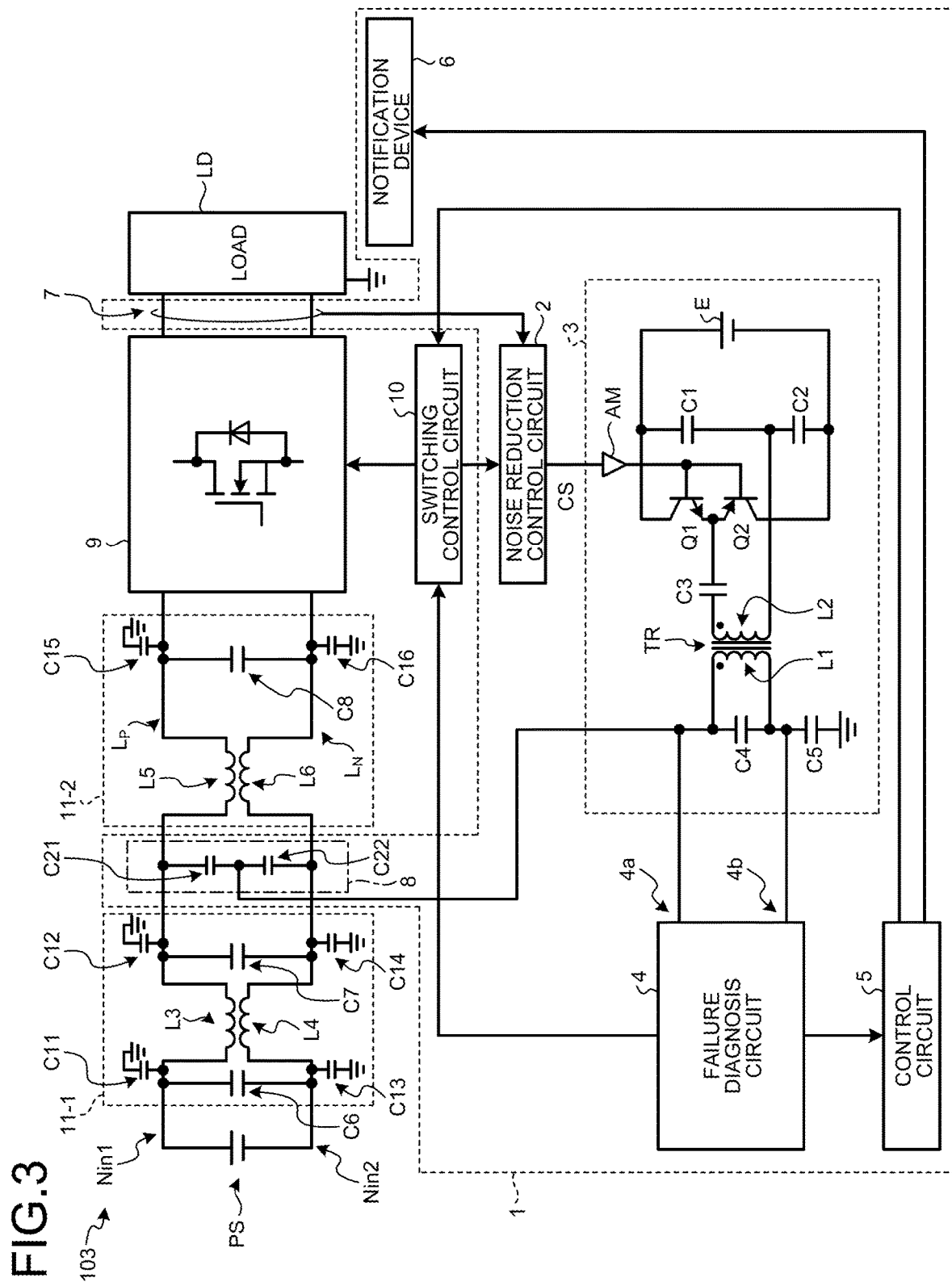
FIG. 3 is a circuit diagram illustrating a configuration of the power conversion device including the noise reduction device according to the embodiment.

The power conversion device 103 including the noise reduction device 1 as a drive device can be configured as illustrated in FIG. 3. FIG. 3 is a circuit diagram illustrating a configuration of the power conversion device 103 including the noise reduction device 1.

The power conversion device 103 includes a noise reduction device 1, a switching circuit 9, a switching control circuit 10, a noise filter circuit 11-1, and a noise filter circuit 11-2. The noise reduction device 1 includes a noise reduction control circuit 2, a noise reduction circuit 3, a failure diagnosis circuit 4, a control circuit 5, a notification device 6, a detection circuit 7, and an injection circuit 8.

In the power conversion device 103, the power conversion function 103*a* (see FIG. 2) is mainly implemented by the switching circuit 9 and the switching control circuit 10. The noise reduction function 103*b* is implemented by the noise reduction device 1. The ANC function 103*b*1 is implemented by the noise reduction circuit 3. The failure diagnosis function 103*b*2 is implemented by the noise reduction control circuit 2, the failure diagnosis circuit 4, the control circuit 5, the notification device 6, the detection circuit 7, and the injection circuit 8. The control function 103*b*21 is mainly implemented by the noise reduction control circuit 2, the failure diagnosis circuit 4, the control circuit 5, the notification device 6, and the detection circuit 7. The detection function 103*b*22 is implemented by the failure diagnosis circuit 4. The ON/OFF switching function 103*b*23 is implemented by the failure diagnosis circuit 4 or the control circuit 5. The injection function 103*b*24 is implemented by the injection circuit 8.

The switching circuit 9 is connected between the power supply PS and the load LD. The noise filter circuit 11-1 and the noise filter circuit 11-2 are connected between the power supply PS and the switching circuit 9. The switching circuit 9 includes a plurality of switching elements. The plurality of switching elements performs a switching operation in accordance with a gate signal supplied from the switching control circuit 10. As a result, the switching circuit 9 normally converts power supplied from the power supply PS via the noise filter circuits 11-1 and 11-2 and supplies the converted power to the load LD.

The noise filter circuit 11-1 is disposed between the power supply PS and the injection circuit 8, and includes, for example, common mode coils L3 and L4, line-to-line capacitors C7 and C6, and line-to-ground capacitors C12, C11, C14, and C13.

One ends of the common mode coils L3 and L4 are connected to input nodes Nin1 and Nin2, respectively, and the other ends of the common mode coils L3 and L4 are connected to the injection circuit 8. The common mode coils L3 and L4 are wound around a core in the same phase to cancel magnetic fluxes of currents flowing through the coils relative to each other, thereby making it possible to attenuate common mode noise.

One end of each of the line-to-line capacitors C7 and C6 is connected to a line connecting the input node Nin1 and the injection circuit 8 to each other, and the other end of each of the line-to-line capacitors C7 and C6 is connected to a line connecting the input node Nin2 and the injection circuit 8 to each other. The line-to-line capacitors C7 and C6 can attenuate normal mode noise by bypassing the noise between lines.

One end of each of the line-to-ground capacitors C12 and C11 is connected to a line connecting the input node Nin1 and the injection circuit 8 to each other, and the other end of each of the line-to-ground capacitors C12 and C11 is connected to a ground potential. The line-to-ground capacitors C12 and C11 can attenuate common mode noise by bypassing the noise to the ground potential.

One end of each of the line-to-ground capacitors C14 and C13 is connected to a line connecting the input node Nin2 and the injection circuit 8 to each other, and the other end of each of the line-to-ground capacitors C14 and C13 is connected to a ground potential. The line-to-ground capacitors C14 and C13 can attenuate common mode noise by bypassing the noise to the ground potential.

The noise filter circuit 11-2 is disposed between the injection circuit 8 and the switching circuit 9, and includes, for example, common mode coils L5 and L6, a line-to-line capacitor C8, and line-to-ground capacitors C15 and C16.

One end of each of the common mode coils L5 and L6 is connected to the injection circuit 8, and the other end of each of the common mode coils L5 and L6 is connected to the switching circuit 9. The common mode coils L5 and L6 are wound around a core in the same phase to cancel magnetic fluxes of currents flowing through the coils relative to each other, thereby making it possible to attenuate common mode noise.

One end of the line-to-line capacitor C8 is connected to a P-side line $L_P$ connecting the injection circuit 8 and the switching circuit 9 to each other, and the other end of the line-to-line capacitor C8 is connected to an N-side line $L_N$ connecting the injection circuit 8 and the switching circuit 9 to each other. The line-to-line capacitor C8 can attenuate normal mode noise by bypassing the noise between lines.

One end of the line-to-ground capacitor C15 is connected to the P-side line $L_P$ connecting the injection circuit 8 and the switching circuit 9 to each other, and the other end of the line-to-ground capacitor C15 is connected to a ground potential. The line-to-ground capacitor C15 attenuates common mode noise by bypassing the noise to the ground potential.

One end of the line-to-ground capacitor C16 is connected to the N-side line $L_N$ connecting the injection circuit 8 and the switching circuit 9 to each other, and the other end of the line-to-ground capacitor C16 is connected to a ground potential. The line-to-ground capacitor C16 attenuates common mode noise by bypassing the noise to the ground potential.

In the power conversion device 103, there may be a noise component that cannot be removed by the noise filter circuits 11-1 and 11-2, and the noise reduction device 1 is provided to suppress the noise component that cannot be removed.

In the noise reduction device 1, the detection circuit 7 is disposed between the switching circuit 9 and the load LD. The detection circuit 7 detects a parameter corresponding to a noise component. In a case where three-phase AC power is supplied from the switching circuit 9 to the load LD, the detection circuit 7 may detect, for example, a current corresponding to three-phase imbalance. The detection circuit 7 supplies the detected parameter to the noise reduction control circuit 2.

The noise reduction control circuit 2 is disposed between the detection circuit 7 and the noise reduction circuit 3. The noise reduction control circuit 2 generates a control signal CS in accordance with the supplied parameter. The parameter (for example, three-phase currents) is changed at a timing of synchronization with the power supplied from the switching circuit 9 to the load LD. Therefore, the noise reduction control circuit 2 can generate a control signal CS for operating the noise reduction device 1 in synchronization with the power supplied from the switching circuit 9 to the load LD in accordance with the supplied parameter. The noise reduction control circuit 2 supplies the control signal CS to the noise reduction circuit 3.

The noise reduction circuit 3 is disposed between the noise reduction control circuit 2, the failure diagnosis circuit 4, the injection circuit 8, and the detection circuit 7. The noise reduction circuit 3 generates an offset signal with reverse polarity of a noise component generated in the load LD. The noise reduction circuit 3 may generate the offset signal in the form of voltage. The noise reduction circuit 3 supplies the offset signal to the injection circuit 8.

The noise reduction circuit 3 includes a power supply E, a capacitive element C1, a capacitive element C2, an amplifier AM, a transistor Q1, a transistor Q2, a capacitive element C3, an isolation transformer TR, a capacitive element C4, and a capacitive element C5.

The power supply E is a DC power supply. The transistor Q1 and the transistor Q2 are connected in series to both ends of the power supply E. An output node of the noise reduction control circuit 2 is connected to a control terminal of each of the transistor Q1 and the transistor Q2 via the amplifier AM. A common connection terminal of the transistor Q1 and the transistor Q2 is connected to one end of a secondary winding L2 via the capacitive element C3.

The transistor Q1 and the transistor Q2 are bridge-connected to each other. The transistors Q1 and Q2 may be bipolar transistors or MOSFETs. In a case where the transistors Q1 and Q2 are bipolar transistors, the transistor Q1 is an NPN transistor, and the transistor Q2 is a PNP transistor. In a case where the transistors Q1 and Q2 are MOSFETs, the transistor Q1 is a P-channel MOSFET, and the transistor Q2 is an N-channel MOSFET.

The capacitive element C1 and the capacitive element C2 are connected in series to both ends of the power supply E, in parallel with the series connection of the transistor Q1 and the transistor Q2 to both ends of the power supply E. One end of the capacitive element C1 is connected to a positive electrode of the power supply E, one end of the capacitive element C2 is connected to a negative electrode of the power supply E, and both the other ends of the capacitive element C1 and the capacitive element C2 are connected to one end of the secondary winding L2.

The isolation transformer TR includes a primary winding L1 and a secondary winding L2. A ratio of the number of windings of the primary winding L1 to the number of windings of the secondary winding L2 is 1:1. The primary winding L1 and the secondary winding L2 are disposed at positions where they can be magnetically coupled to each other. The isolation transformer TR may have a magnetic core. The primary winding L1 and the secondary winding L2 may be magnetically coupled to each other via the magnetic core.

The capacitive element C4 is connected to both ends of the primary winding L1. One end of the capacitive element C4 is connected to one end of the primary winding L1, the injection circuit 8, and a detection node 4a of the failure diagnosis circuit 4, and the other end of the capacitive element C4 is connected to the other end of the primary winding L1, a detection node 4b of the failure diagnosis circuit 4, and one end of the capacitive element C5.

The capacitive element C5 is connected between the capacitive element C4 and a reference potential (for example, a ground potential). One end of the capacitive element C5 is connected to the other end of the capacitive element C4, the other end of the primary winding L1, and the detection node 4b of the failure diagnosis circuit 4, and the other end of the capacitive element C5 is connected to the reference potential.

The load LD, for example, a housing thereof, is connected to the reference potential, and a noise component may leak toward the reference potential through the housing. This noise component flows into the other end of the capacitive element C5 through the reference potential, and a voltage corresponding to the noise component is generated across the capacitive element C5. Accordingly, a voltage with reverse polarity of the voltage across the capacitive element C5, that is, a voltage with reverse polarity of the noise component, can be generated across the capacitive element C4. At this time, each of the transistor Q1 and the transistor Q2 is turned on or off in accordance with a control signal CS, and a signal according to the control signal CS is sequentially transmitted to the capacitive element C3, the secondary winding L2, and the primary winding L1 in this order. As a result, an offset signal with reverse polarity of the noise component appears as a voltage across the capacitive element C4, and this offset signal is transmitted to the injection circuit 8. An amplitude absolute value of the offset signal is preferably within an appropriate range to be regarded as being substantially equal to an amplitude absolute value of the noise component.

The injection circuit 8 is connected between the power supply PS and the switching circuit 9. For example, The injection circuit Bis connected between the noise filter circuit 11-1 and the noise filter circuit 11-2. The injection circuit 8 injects an offset signal between the noise filter circuit 11-1 and the noise filter circuit 11-2. The injection circuit 8 includes, for example, a capacitive element C21 and a capacitive element C22. The capacitive element C21 and the capacitive element C22 are connected to each other in series between the P-side line and the N-side line, and one end of the capacitive element C4 holding the offset signal is connected to a connection point between the capacitive element C21 and the capacitive element C22. When capacitance values of the capacitive element C21 and the capacitive element C22 are equal, a common mode component between a P-side signal and an N-side signal appears at the connection point. The offset signal may be injected into the common mode component.

The offset signal is injected between the noise filter circuit 11-1 and the noise filter circuit 11-2, and the offset signal can be injected into the noise component passing through the noise filter circuit 11-1 and the noise filter circuit 11-2. Therefore, the noise component can be effectively offset. The influence of the offset signal on the power supply PS side or the load LD side can be reduced by the noise filter circuit 11-1 and the noise filter circuit 11-2.

If the noise reduction circuit 3 fails, the amplitude absolute value of the offset signal may decrease to be lower than the appropriate range, making it difficult to offset the noise component. Alternatively, if the noise reduction circuit 3 fails, the amplitude absolute value of the offset signal may increase to be higher than the appropriate range, the noise component may be excessively offset. In this case, the offset signal itself may become a new noise component.

Therefore, the failure diagnosis circuit 4 detects a level of the offset signal. The failure diagnosis circuit 4 detects a voltage at one end of the capacitive element C4 through the detection node 4a, and detects a voltage at the other end of the capacitive element C4 through the detection node 4b. The failure diagnosis circuit 4 is able to detect the level of the offset signal by taking a difference between the voltage detected by the detection node 4a and the voltage detected by the detection node 4b.

The failure diagnosis circuit 4 determines whether the detected level deviates from the appropriate range. The failure diagnosis circuit 4 obtains a level of the noise component by taking a difference between a voltage detected at the detection node 4b and a reference potential (for example, a ground potential). The failure diagnosis circuit 4 may use, as a target level of the offset signal, a level having reverse polarity of the level of the noise component, and set a range deviating from the target level at a predetermined ratio (for example, ±5%) as an appropriate range of the offset signal.

The failure diagnosis circuit 4 diagnoses whether or not a failure has occurred in the noise reduction circuit on the basis of a determination result. In a case where the detected level deviates from the appropriate range, the failure diagnosis circuit 4 diagnoses that a failure has occurred in the noise reduction circuit 3. In a case where the detected level is within the appropriate range, the failure diagnosis circuit 4 diagnoses that no failure has occurred in the noise reduction circuit 3. The failure diagnosis circuit 4 supplies a diagnosis result to the control circuit 5.

The control circuit 5 may receive the diagnosis result from the failure diagnosis circuit 4 to control the switching control circuit 10 on the basis of the diagnosis result. An ECU or the like can be used as the control circuit 5.

For example, the control circuit 5 may operate the switching circuit 9 with predetermined low power in accordance with a diagnosis result indicating that a failure has occurred. The predetermined low power refers to power lower than normal power, and also refers to power from which a noise component can be removed up to a level allowed by the noise filter circuits 11-1 and 11-2. The control circuit 5 controls the switching control circuit 10 to keep the switching circuit 9 operated with current power in accordance with a diagnosis result indicating that no failure has occurred. The control circuit 5 controls the switching control circuit 10 to operate the switching circuit 9 with predetermined low power in accordance with a diagnosis result indicating that a failure has occurred. During PWM control performed by the switching control circuit 10, the control circuit 5 may control the switching control circuit 10 to limit a pulse width of a gate signal to be supplied to the switching circuit 9 to a predetermined pulse width or less. During PFM control performed by the switching control circuit 10, the control circuit 5 may control the switching control circuit 10 to limit a frequency of a gate signal to be supplied to the switching circuit 9 to a predetermined frequency or less. As a result, a level of EMI noise emitted from the power conversion device 103 can be equal to or less than a value stipulated by the law or equal to or less than a predetermined noise level.

In addition, the control circuit 5 may restart the switching circuit 9 in accordance with a diagnosis result indicating that a failure has occurred. The control circuit 5 restarts the switching circuit 9 after operating the switching circuit 9 with predetermined low power for a predetermined time in accordance with a diagnosis result indicating that a failure has occurred. As a result, if unnecessary charges remain in the switching circuit 9, the unnecessary charges can be discharged, making it possible for the noise reduction circuit to escape the failure state. Alternatively, the noise reduction circuit 3 can escape the failure state. As a result, it is possible to reduce EMI noise in the power conversion device 103.

Alternatively, the control circuit 5 may stop the switching circuit 9 in accordance with a diagnosis result indicating that a failure has occurred. The control circuit 5 controls the switching control circuit 10 to continue to supply a gate signal to the switching circuit 9 in accordance with a diagnosis result indicating that no failure has occurred. The control circuit 5 controls the switching control circuit 10 to stop supplying a gate signal to the switching circuit 9 in accordance with a diagnosis result indicating that a failure has occurred. That is, the control circuit 5 stops the switching circuit 9 in accordance with a diagnosis result indicating that a failure has occurred. As a result, it is possible to prevent EMI noise from occurring in the power conversion device 103.

Moreover, the control circuit 5 may control the notification device 6 in accordance with a diagnosis result. In accordance with a diagnosis result indicating that no failure has occurred, the control circuit 5 controls the notification device 6 to stand by. In accordance with a diagnosis result indicating that a failure has occurred, the control circuit 5 controls the notification device 6 to make notification of the occurrence of the failure. The notification device 6 may perform notification by a visual means or may perform notification by an auditory means. The visual means may be, for example, displaying an error message on a display inside the vehicle, or turning on or blinking an alarm lamp inside the vehicle. The auditory means may be, for example, outputting an error message by voice from a speaker inside the vehicle, or sounding a buzzer. As a result, a user can recognize that a failure has occurred in the noise reduction circuit 3, and can be urged to perform maintenance (repair or the like) of the noise reduction circuit 3.

Note that, in place of the control circuit 5, the failure diagnosis circuit 4 may directly control the switching control circuit 10 in accordance with a diagnosis result.

Figure 4:
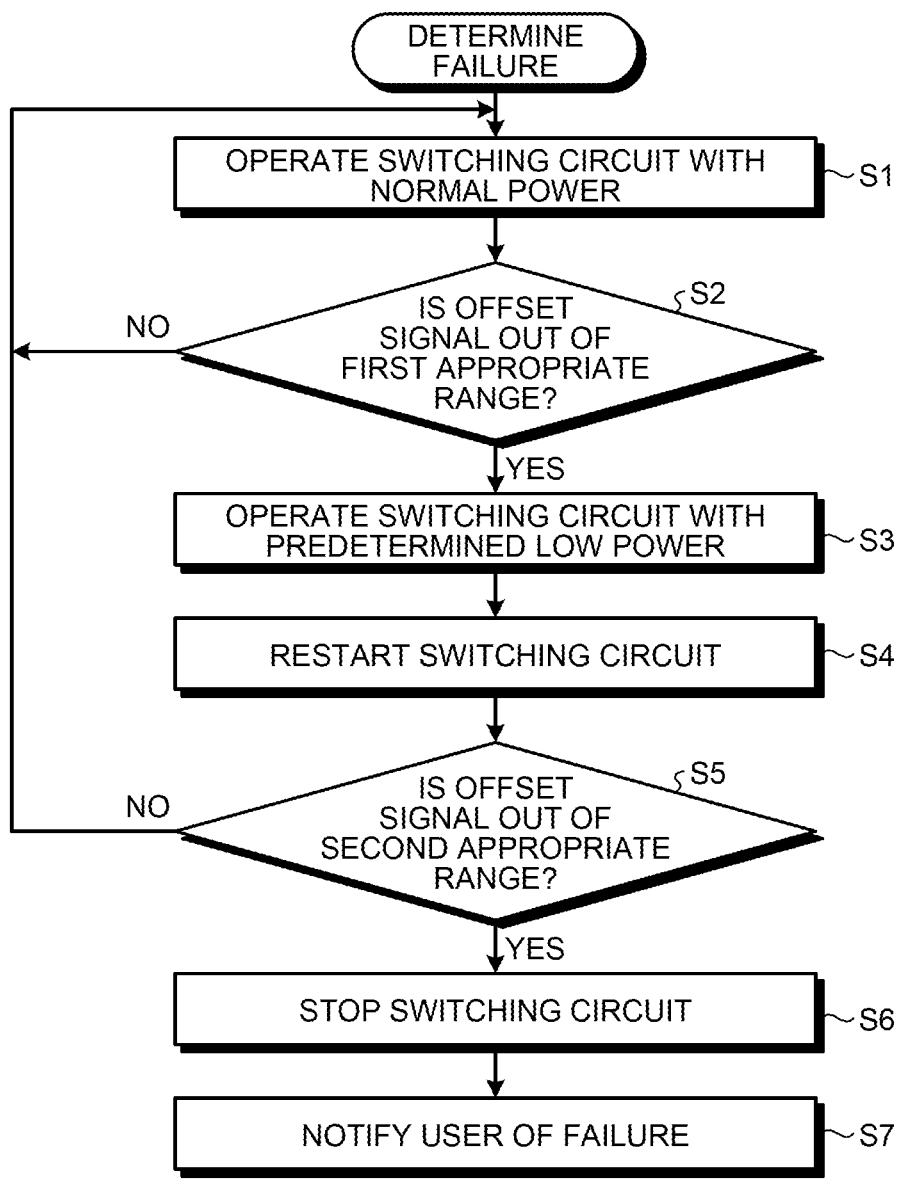
FIG. 4 is a flowchart illustrating an operation of the power conversion device including the noise reduction device according to the embodiment.

Alternatively, the noise reduction device 1 may diagnose a failure stepwise as illustrated in FIG. 4. FIG. 4 is a flowchart illustrating an operation of the power conversion device 103 including the noise reduction device 1.

In a case where the diagnosis of the failure is performed in two stages, a first appropriate range including a target level of an offset signal and a second appropriate range including the target level and the first appropriate range may be provided as appropriate ranges for use in the diagnosis of the failure. The first appropriate range of the offset signal may be a range deviating from the target level of the offset signal at a predetermined ratio (for example, ±3%). The second appropriate range of the offset signal may be a range deviating from the target level of the offset signal at a larger predetermined ratio (for example, ±6%).

When the power supply PS starts to supply power, the power conversion device 103 operates the switching circuit 9 with normal power (S1). The noise reduction device 1 detects a noise component generated in the load LD and generates an offset signal with reverse polarity of the noise component. The noise reduction device 1 injects the generated offset signal between the power supply PS and the switching circuit 9 through the injection circuit 8.

The noise reduction device 1 detects a noise signal to set a first appropriate range, detects a level of the offset signal, and determines whether or not the offset signal deviates from (that is, the offset signal is out of) the first appropriate range (S2). The noise reduction device 1 determines that no failure has occurred in the noise reduction circuit 3 while the offset signal does not deviate from the first appropriate range (No in S2), and then operates the switching circuit 9 with normal power (S1).

In response to determining that the offset signal deviates from the first appropriate range (Yes in S2), the noise reduction device 1 determines that a failure has occurred in the noise reduction circuit 3 and then operates the switching circuit 9 with predetermined low power (S3). The predetermined low power is lower than normal power, and refers to power from which a noise component can be removed to a level allowed by the noise filter circuits 11-1 and 11-2. The noise reduction device 1 may include, for example, a timer (not illustrated) in the control circuit 5 to measure a duration of the operation with the predetermined low power (S3) by using the timer.

When the duration of the operation with the predetermined low power (S3) reaches a predetermined time, the noise reduction device 1 restarts the switching circuit 9 (S4). That is, the noise reduction device 1 temporarily stops the switching circuit 9, stands by for a predetermined time, and then restarts the operation of the switching circuit 9.

The noise reduction device 1 detects a noise signal to set a second appropriate range and detects a level of the offset signal. Then, the noise reduction device 1 determines whether or not the offset signal deviates from the second appropriate range (S5). In response to determining that the offset signal is within (namely, does not deviate from) the second appropriate range (No in S5), the noise reduction device 1 determines that the failure of the noise reduction circuit 3 is temporary and the offset signal has already become within the second appropriate range, and operates the switching circuit 9 with the normal power (S1).

In response to determining that the offset signal deviates from the second appropriate range (Yes in S5), the noise reduction device 1 determines that the failure of the noise reduction circuit 3 is not temporary and is currently continuing, and stops the switching circuit 9 (S6). Then, the noise reduction device 1 notifies the user of the occurrence of the failure (S7).

The diagnosis of the failure may be performed in n-stages (n is an integer of 3 or more). In this case, a first appropriate range including a target level of an offset signal, a second appropriate range including the target level and the first appropriate range, . . . , and an nth appropriate range including the target level, the first appropriate range, . . . , an (n−1)th appropriate range may be provided as appropriate ranges for use in the diagnosis of the failure. The first appropriate range of the offset signal may be a range deviating from the target level of the offset signal at a predetermined ratio (for example, ±1%). The second appropriate range of the offset signal may be a range deviating from the target level of the offset signal at a larger predetermined ratio (for example, ±2%). The nth appropriate range of the offset signal may be a range deviating from the target level of the offset signal at a larger predetermined ratio (for example, ±n %).

As described above, in the noise reduction device 1 according to the present embodiment, the failure diagnosis circuit 4 detects a level of an offset signal, determines whether or not the level of the offset signal deviates from an appropriate range, and diagnoses whether a failure has occurred in the noise reduction circuit 3 on the basis of a determination result. In accordance with a diagnosis result indicating that a failure has occurred, the noise reduction device 1 operates the switching circuit 9 with low power, stops the switching circuit 9, or causes the notification device 6 to make notification of the occurrence of the failure. As a result, it is possible to suppress an increase in EMI noise or the like resulting from a failure of the noise reduction circuit 3, thereby providing a power conversion device that complies with noise-related laws.

In addition, in the power conversion device 103 according to the present embodiment, noise resulting from conversion of power is suppressed by the noise filter circuits 11-1 and 11-2 and the noise reduction device 1. Therefore, it is possible to reduce sizes of the noise filter circuits 11-1 and 11-2 as compared with a case where noise is suppressed by the noise filter circuits 11-1 and 11-2 alone. In addition, the noise reduction device 1 performs diagnosis as to whether a failure has occurred in the noise reduction circuit 3, and performs processing for suppressing an influence of a failure in response to diagnosing that the failure has occurred. As a result, it is possible to reduce the size of the power conversion device 103 while suppressing an increase in noise.

The injection circuit 8 according to the embodiment is connected between the noise filter circuit 11-1 and the noise filter circuit 11-2, whereas the injection circuit 8 may be connected between the noise filter circuit 11-2 and the switching circuit 9.

Moreover, the noise reduction device 1 according to the embodiment injects an offset signal in the form of voltage, whereas the noise reduction device 1 may have any configuration capable of reducing noise in the power conversion device 103.

Figure 5:
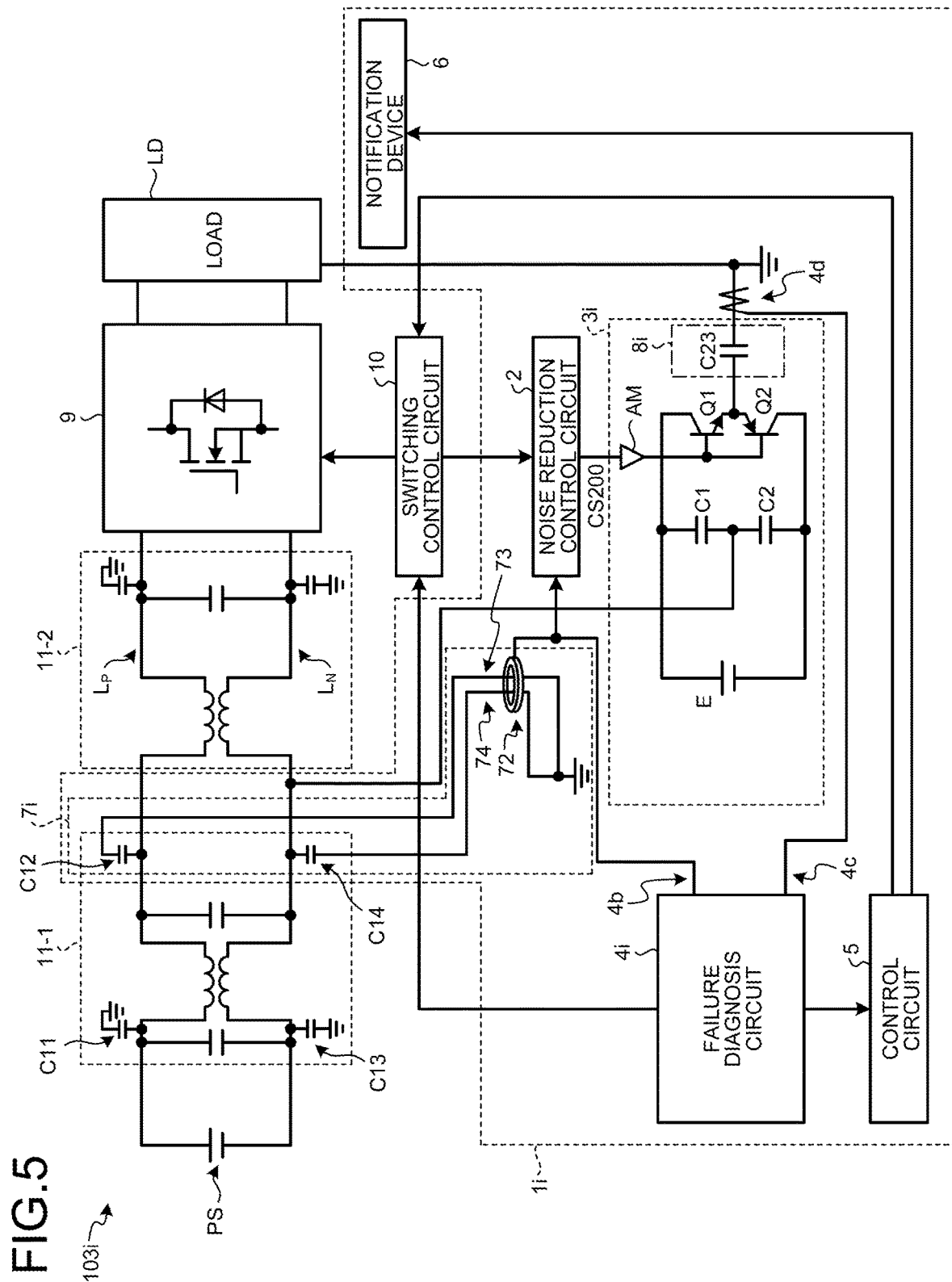
FIG. 5 is a diagram illustrating a configuration of a power conversion device including a noise reduction device according to a first modification of the embodiment.

For example, as a first modification of the embodiment, a noise reduction device 1i may be configured to inject an offset signal in the form of current as illustrated in FIG. 5. FIG. 5 is a diagram illustrating a configuration of a power conversion device 103i including the noise reduction device 1i according to the first modification of the embodiment.

The noise reduction device 1i includes a noise reduction circuit 3i, a failure diagnosis circuit 4i, a detection circuit 7i, and an injection circuit 8i, instead of the noise reduction circuit 3, the failure diagnosis circuit 4, the detection circuit 7, and the injection circuit 8 (see FIG. 3).

The noise reduction circuit 3i generates an offset signal with reverse polarity of a noise component generated in a load in the form of current. The noise reduction circuit 3i includes a power supply E, a capacitive element C1, a capacitive element C2, a transistor Q1, and a transistor Q2.

The detection circuit 7i detects a parameter corresponding to a noise component. The detection circuit 7i includes a capacitive element C12, a capacitive element C14, and a current detector 72. As the current detector 72, for example, a current detector using the Hall effect, a zero-phase current transformer including an annular core, or the like can be used. The current detector 72 detects a difference between a current passing through a line 73 connecting the capacitive element C12 and the ground to each other and a current passing through a line 74 connecting the capacitive element C14 and the ground as a parameter corresponding to a noise component.

The detection circuit 7i is inserted between the noise filter circuit 11-1 and the noise filter circuit 11-2, and a noise component passing through the noise filter circuit 11-1 or the noise filter circuit 11-2 can be detected. Therefore, the noise component to be offset can be effectively detected.

The detection circuit 7i supplies a parameter corresponding to the detected noise component to the noise reduction control circuit 2.

In accordance with the parameter, the noise reduction control circuit 2 controls the transistors Q1 and Q2 of the noise reduction circuit 3i to be turned on or off. As a result, the noise reduction circuit 3i generates an offset signal in the form of current, and supplies the offset signal to the injection circuit 8i. The injection circuit 8i includes a capacitive element C23, and injects an offset signal to a reference potential commonly connected to and a housing of the load LD in the form of current using the capacitive element C23.

The failure diagnosis circuit 4i includes a detection node 4b, a detection node 4c, and a detector 4d. The detection node 4b is connected to the detection circuit 7i. The failure diagnosis circuit 4i receives a parameter corresponding to the noise component through the detection node 4b, and obtains a level of the noise component in accordance with the parameter. Using a level having reverse polarity of the level of the noise component as a target level of the offset signal, the failure diagnosis circuit 4i may set a range deviating from the target level at a predetermined ratio (for example, ±5%) as an appropriate range of the offset signal.

The detector 4d is disposed between the injection circuit 8i and the reference potential to detect an offset signal injected from the injection circuit 8i to the reference potential. The failure diagnosis circuit 4i receives a level of the offset signal detected by the detector 4d through the detection node 4c.

The failure diagnosis circuit 4i is similar to that in the embodiment in that the failure diagnosis circuit 4i determines whether the detected level deviates from the appropriate range and diagnoses whether or not a failure has occurred in the noise reduction circuit on the basis of a determination result. The operations of the control circuit 5 and the notification device 6 according to the diagnosis result of the failure diagnosis circuit 4i are also similar to those in the embodiment.

As described above, the noise reduction device 1i that injects an offset signal in the form of current also operates the switching circuit 9 with low power, stops the switching circuit 9, or causes the notification device 6 to make notification of the occurrence of the failure, in accordance with a diagnosis result indicating that a failure has occurred. As a result, it is possible to suppress an increase in EMI noise or the like resulting from a failure of the noise reduction circuit 3i, thereby providing a power conversion device that complies with noise-related laws.

Figure 6:
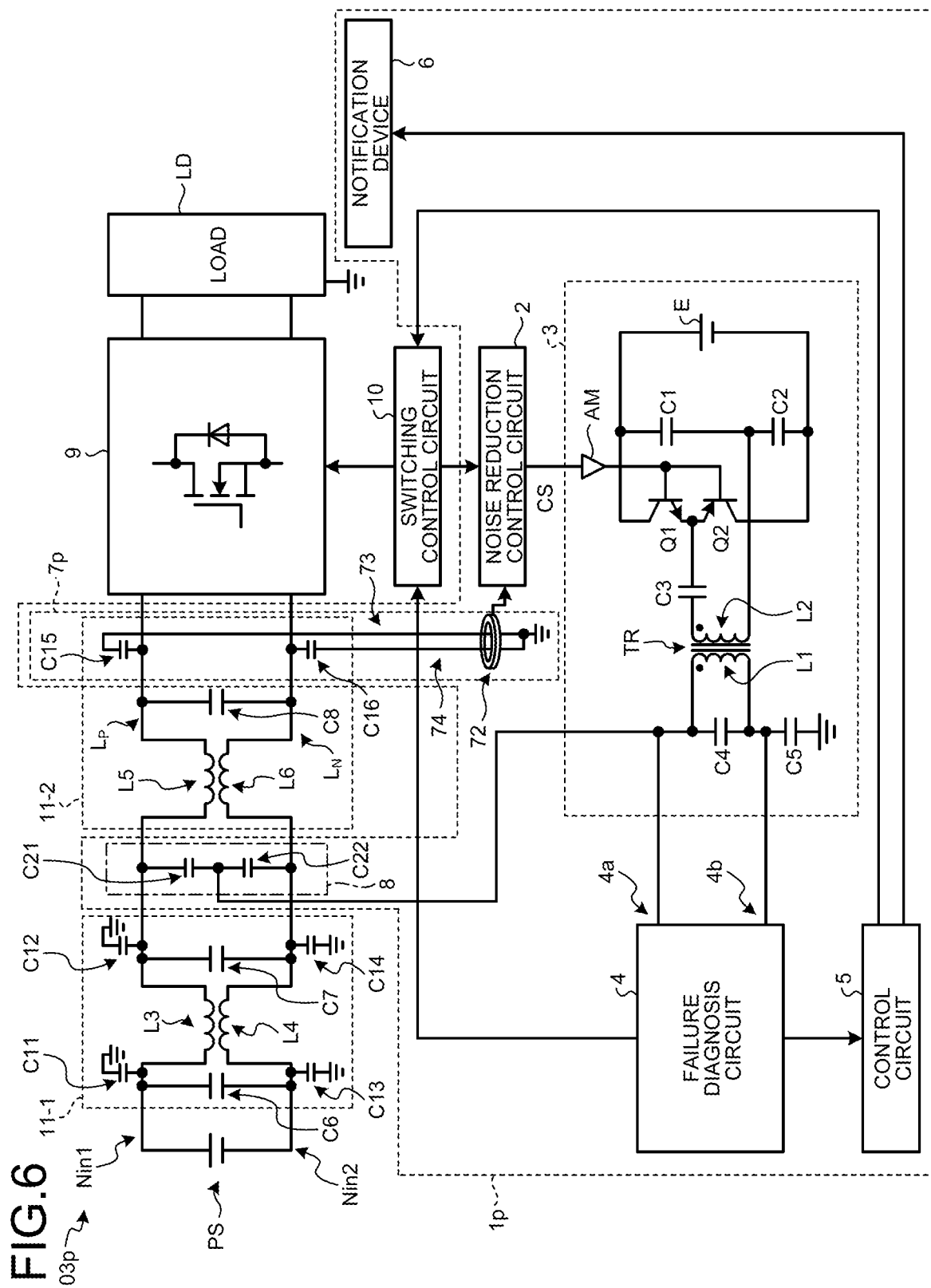
FIG. 6 is a diagram illustrating a configuration of a power conversion device including a noise reduction device according to a second modification of the embodiment.

Moreover, as a second modification of the embodiment, as illustrated in FIG. 6, in a power conversion device 103p, a noise reduction device 1p may detect a noise signal between the noise filter circuit 11-2 and the switching circuit 9. FIG. 6 is a diagram illustrating a configuration of the power conversion device 103p including the noise reduction device 1p according to the second modification of the embodiment.

In the noise reduction device 1p, a detection circuit 7p is connected between the noise filter circuit 11-2 and the switching circuit 9. The detection circuit 7p detects a parameter corresponding to a noise component between the noise filter circuit 11-2 and the switching circuit 9. The detection circuit 7p includes a capacitive element C15, a capacitive element C16, and a current detector 72. As the current detector 72, a zero-phase current transformer including an annular core or the like can be used. The current detector 72 detects a difference between currents passing through lines 73 and 74 as a parameter corresponding to a noise component.

At this time, the injection circuit 8 is connected between the power supply PS and the switching circuit 9. The injection circuit 8 may be connected between the noise filter circuit 11-1 and the noise filter circuit 11-2, or may be connected between the power supply PS and the noise filter circuit 11-1.

As described above, the detection circuit 7p is inserted between the noise filter circuit 11-2 and the switching circuit 9, and a noise component passing through the noise filter circuit 11-1 or 11-2 can be detected. Therefore, the noise component to be offset can be effectively detected.

Figure 7:
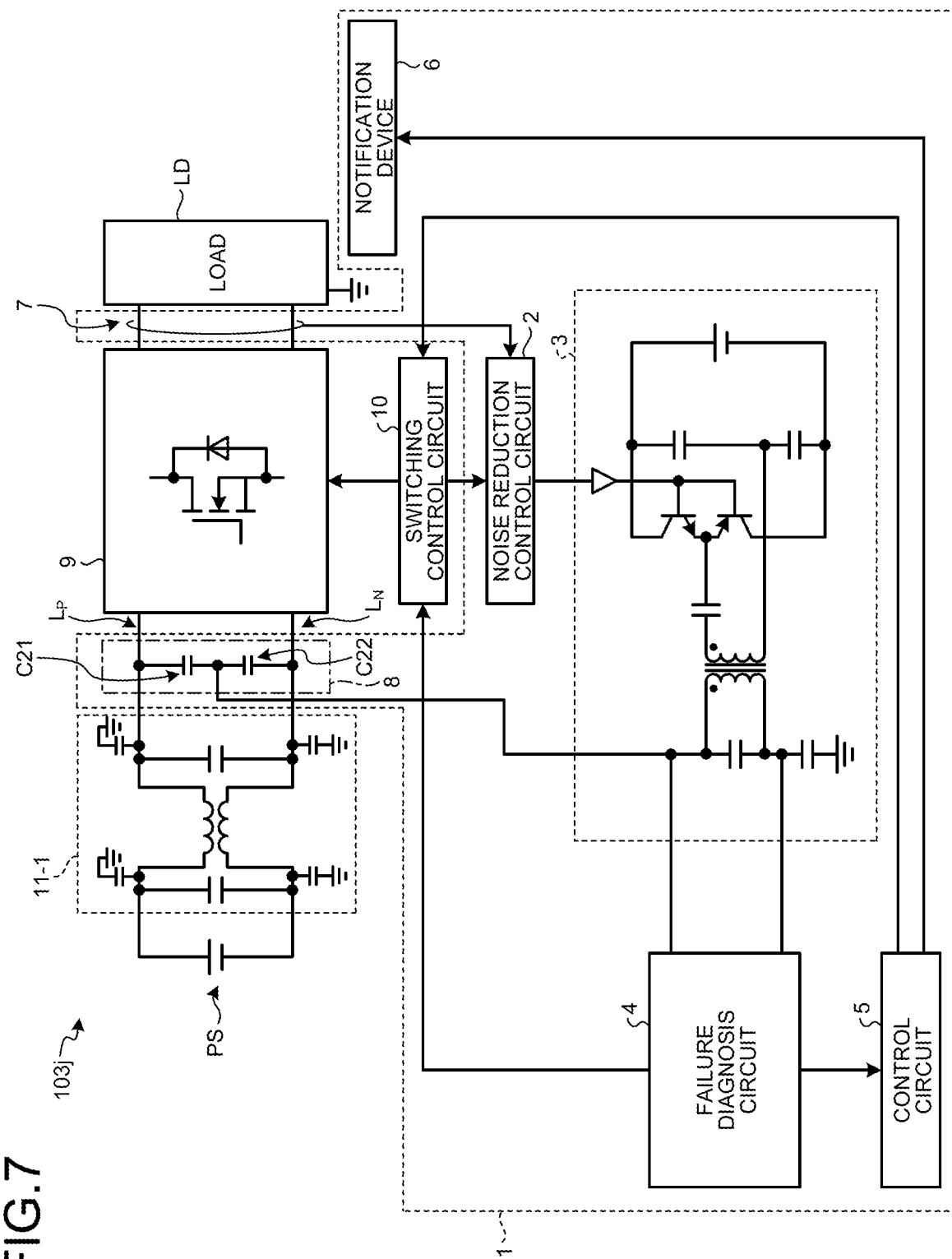
FIG. 7 is a diagram illustrating a configuration of a power conversion device including a noise reduction device according to a third modification of the embodiment.

Moreover, as a third modification of the embodiment, as illustrated in FIG. 7, in a case where a power conversion device 103j includes one noise filter circuit 11-1 with no noise filter circuit 11-2, the noise reduction device 1 may inject an offset signal between the noise filter circuit 11-1 and the switching circuit 9. FIG. 7 is a diagram illustrating a configuration of the power conversion device including the noise reduction device 1 according to the third modification of the embodiment.

In the noise reduction device 1, an injection circuit 8 is connected between the noise filter circuit 11-1 and the switching circuit 9. The injection circuit 8 injects an offset signal between the noise filter circuit 11-1 and the switching circuit 9. The injection circuit 8 includes a capacitive element C21 and a capacitive element C22. The capacitive element C21 and the capacitive element C22 are connected to each other in series between a P-side line $L_P$ and an N-side line $L_N$, and one end of the capacitive element C4 holding the offset signal is connected to a connection point between the capacitive element C21 and the capacitive element C22. When capacitance values of the capacitive element C21 and the capacitive element C22 are equal, a common mode component between a P-side signal and an N-side signal appears at the connection point. The offset signal may be injected into the common mode component.

As described above, the offset signal is injected between the noise filter circuit 11-1 and the switching circuit 9, and the offset signal can be injected into the noise component passing through the noise filter circuit 11-1. Therefore, the noise component can be effectively offset. Besides, the noise filter circuit 11-1 makes possible to reduce an influence of the offset signal on the power supply PS side.

Figure 8:
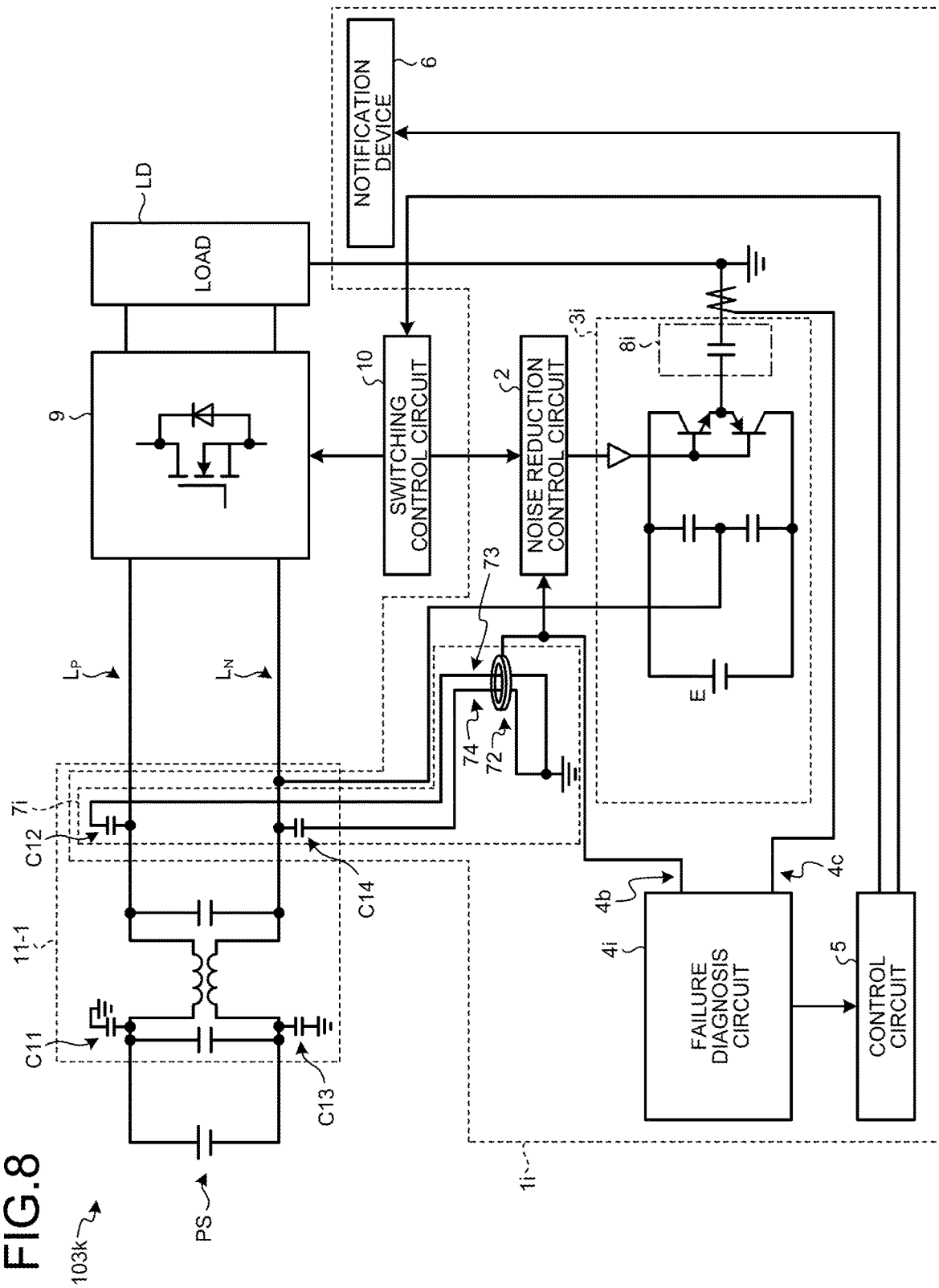
FIG. 8 is a diagram illustrating a configuration of a power conversion device including a noise reduction device according to a fourth modification of the embodiment.

Moreover, as a fourth modification of the embodiment, as illustrated in FIG. 8, in a case where a power conversion device 103k includes one noise filter circuit 11-1 with no noise filter circuit 11-2, a noise reduction device 1i may detect a noise signal between the noise filter circuit 11-1 and the switching circuit 9. FIG. 8 is a diagram illustrating a configuration of the power conversion device 103k including the noise reduction device 1i according to the fourth modification of the embodiment.

In the noise reduction device 1i, a detection circuit 7i is connected between the noise filter circuit 11-1 and the switching circuit 9. The detection circuit 7i detects a parameter corresponding to a noise component between the noise filter circuit 11-1 and the switching circuit 9. The detection circuit 7i includes a capacitive element C12, a capacitive element C14, and a current detector 72. As the current detector 72, for example, a zero-phase current transformer including an annular core or the like can be used. The current detector 72 detects a difference between a current passing through a line 73 connecting the capacitive element C12 and the ground to each other and a current passing through a line 74 connecting the capacitive element C14 and the ground as a parameter corresponding to a noise component.

As described above, the detection circuit 7i is inserted between the noise filter circuit 11-1 and the switching circuit 9, and a noise component passing through the noise filter circuit 11-1 can be detected. Therefore, the noise component to be offset can be effectively detected.

Figure 9:
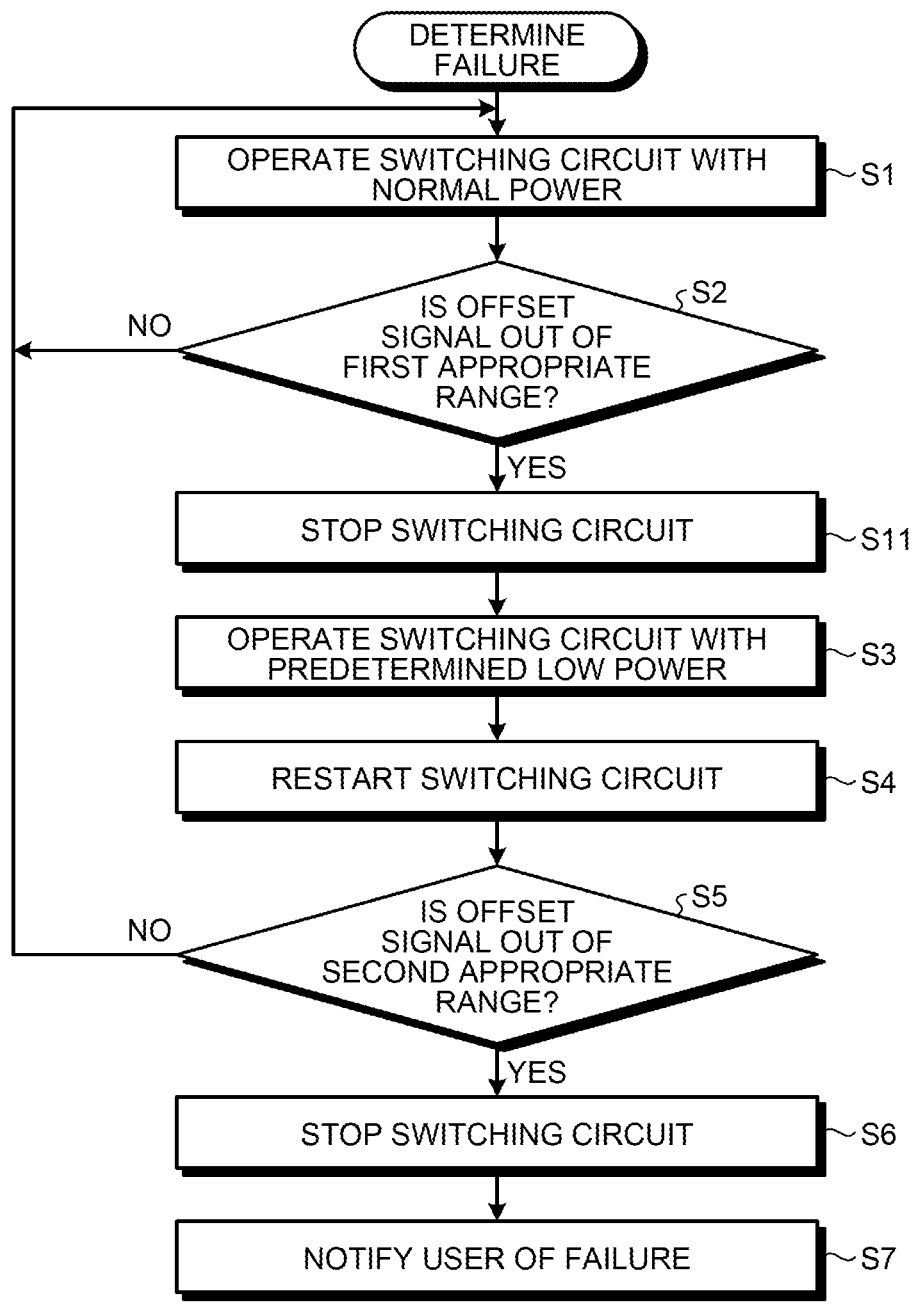
FIG. 9 is a flowchart illustrating an operation of a noise reduction device according to a fifth modification of the embodiment.

Moreover, as a fifth modification of the embodiment, as illustrated in FIG. 9, the switching circuit 9 may be stopped multiple times in accordance with failure diagnosis determined by the noise reduction device 1 in a stepwise manner. FIG. 9 is a flowchart illustrating an operation of the power conversion device 103 including the noise reduction device 1 according to the fifth modification of the embodiment.

In the power conversion device 103, after S1 and S2 are performed, in response to determining that the offset signal deviates from the first appropriate range (Yes in S2), the noise reduction device 1 stops the switching circuit 9 (511), and operates the switching circuit 9 with predetermined low power after a predetermined time elapses (S3). Then, after S4 and S5 are performed, when the offset signal deviates from the second appropriate range (Yes in S5), the noise reduction device 1 stops the switching circuit 9 (S6), and notifies the user of the occurrence of the failure (S7).

As described above, since the switching element 9 is stopped multiple times in accordance with failure diagnosis determined by the noise reduction device 1 in a stepwise manner, if unnecessary charges remain in the switching circuit 9, the unnecessary charges can be discharged, increasing a possibility that the noise reduction circuit can escape the failure state.

Although some embodiments of the present invention have been described, these embodiments are exemplary, and are not intended to limit the scope of the invention. These embodiments can be implemented in various other forms, and various omissions, substitutions, and changes can be made without departing from the gist of the invention. For example, the power supply PS may be an AC power supply, the load LD may be a battery, and the power conversion device may be an in-vehicle charger. Alternatively, the power supply PS may be a battery, the load LD may be a low-voltage second battery, and the power conversion device may be a DC-DC converter. These embodiments and modifications thereof are covered by the appended claims and their equivalents as would fall within the scope and spirit of the inventions.

The noise reduction device according to the present disclosure is capable of suppressing a defect caused by a noise component generated in a load.

What is claimed is:
1. A noise reduction device comprising:
   a detection circuit that, in operation, detects a noise component generated in a load;
   a noise reduction circuit that, in operation, generates an offset signal with reverse polarity of the noise component generated in the load based on the noise component detected by the detection circuit; and
   a failure diagnosis circuit that, in operation,
   detects a level of the offset signal generated by the noise reduction circuit based on the noise component detected by the detection circuit,
   determines whether or not the level of the offset signal deviates from an appropriate range,
   diagnoses, based on a determination result, whether or not a failure has occurred in the noise reduction circuit, diagnoses that a failure has occurred in the noise reduction circuit in response to determining that the level of the offset signal deviates from the appropriate range, and diagnoses that no failure has occurred in the noise reduction circuit in response to determining that the level of the offset signal is within the appropriate range, wherein the noise reduction circuit includes an isolation transformer including a primary winding and a secondary winding, wherein a ratio of a number of windings of the primary winding to a number of windings of the secondary winding is 1:1, wherein a switching circuit connected to the load is controlled with power lower than normal power in a case where the failure diagnosis circuit diagnoses that the failure has occurred in the noise reduction circuit, and wherein the level of the offset signal is substantially equal to a level of the noise component.

2. The noise reduction device according to claim 1, wherein the noise reduction circuit is configured to
detect the noise component generated in the load, and
generate an offset voltage with reverse polarity of the detected noise component.

3. The noise reduction device according to claim 1, wherein the noise reduction circuit is configured to
detect the noise component generated in the load, and
generate generates an offset current with reverse polarity of the detected noise component.

4. The noise reduction device according to claim 1, further comprising a control circuit configured to stop the switching circuit connected to the load in a case where the failure diagnosis circuit diagnoses that a failure has occurred in the noise reduction circuit.

5. The noise reduction device according to claim 1, further comprising a notification device configured to make notification of occurrence of a failure in a case where the failure diagnosis circuit diagnoses that the failure has occurred in the noise reduction circuit.

6. The noise reduction device according to claim 1, wherein the noise reduction device is included in a power conversion device.

7. The power conversion device according to claim 6, further comprising:
a switching circuit connected to a load; and
a first filter circuit disposed between a power supply and the switching circuit,
wherein the noise reduction device further includes a detection circuit connected between the first filter circuit and the switching circuit, the detection circuit being configured to detect the noise component generated in the load.

8. The power conversion device according to claim 6, further comprising:
a switching circuit connected to a load; and
a first filter circuit disposed between a power supply and the switching circuit,
wherein the noise reduction device further includes an injection circuit connected between the first filter circuit and the switching circuit, the injection circuit being configured to inject the offset signal with reverse polarity of the noise component generated in the load.

9. The power conversion device according to claim 6, further comprising:
a switching circuit connected to a load; and
a first filter circuit disposed between a power supply and the switching circuit,
wherein the noise reduction device further includes:
a detection circuit connected between the first filter circuit and the switching circuit, the detection circuit being configured to detect the noise component generated in the load; and
an injection circuit connected between the first filter circuit and the switching circuit, the injection circuit being configured to inject the offset signal with reverse polarity of the noise component generated in the load.

10. The power conversion device according to claim 6, further comprising:
a switching circuit connected to a load;
a first filter circuit disposed between a power supply and the switching circuit; and
a second filter circuit disposed between the first filter circuit and the switching circuit,
wherein the noise reduction device further includes an injection circuit connected between the first filter circuit and the second filter circuit, the injection circuit being configured to inject the offset signal with reverse polarity of the noise component generated in the load.

11. The power conversion device according to claim 6, further comprising:
a switching circuit connected to a load;
a first filter circuit disposed between a power supply and the switching circuit; and
a second filter circuit disposed between the first filter circuit and the switching circuit,
wherein the noise reduction device further includes:
a detection circuit connected between the second filter circuit and the switching circuit, the detection circuit being configured to detect the noise component generated in the load; and
an injection circuit connected between the first filter circuit and the second filter circuit, the injection circuit being configured to inject the offset signal with reverse polarity of the noise component generated in the load.

12. The power conversion device according to claim 6, wherein the power conversion device is included in a vehicle.

13. A noise reduction method comprising:
detecting, by a detection circuit, a noise component generated in a load;
generating, by a noise reduction circuit, an offset signal with reverse polarity of the noise component generated in the load based on the noise component detected by the detection circuit, wherein the noise reduction circuit includes an isolation transformer including a primary winding and a secondary winding, and wherein a ratio of a number of windings of the primary winding to a number of windings of the secondary winding is 1:1;
detecting a level of the offset signal generated by the noise reduction circuit based on the noise component detected by the detection circuit;
determining whether or not the level of the offset signal detected by the detecting deviates from an appropriate range;
diagnosing, based on a determination result, whether or not a failure has occurred in the noise reduction circuit;
diagnosing that a failure has occurred in the noise reduction circuit in response to determining that the level of the offset signal deviates from the appropriate range;

diagnosing that no failure has occurred in the noise reduction circuit in response to determining that the level of the offset signal is within the appropriate range; and controlled a switching circuit connected to the load with power lower than normal power in a case where the failure has been diagnosed, wherein the level of the offset signal is substantially equal to a level of the noise component.

* * * * *